United States Patent
Chang et al.

(10) Patent No.: US 11,656,716 B2
(45) Date of Patent: *May 23, 2023

(54) CONTROL METHOD FOR OPTICAL FINGERPRINT SENSOR AND TOUCH CONTROLLER

(71) Applicant: NOVATEK Microelectronics Corp., Hsin-Chu (TW)

(72) Inventors: Tsen-Wei Chang, Taichung (TW); Chih-Peng Hsia, Hsinchu County (TW); Wei-Lun Shih, Hsinchu (TW); Hong-Chu Chen, Hsinchu (TW); Su-Wei Lien, Hsinchu (TW); Sheng-Wen Hsiao, Changhua County (TW); Liang-Chi Cheng, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/690,016

(22) Filed: Mar. 9, 2022

(65) Prior Publication Data

US 2022/0197466 A1 Jun. 23, 2022

Related U.S. Application Data

(63) Continuation-in-part of application No. 17/107,962, filed on Dec. 1, 2020, now Pat. No. 11,308,306, (Continued)

(30) Foreign Application Priority Data

Jul. 24, 2020 (TW) .................................. 109125075

(51) Int. Cl.
*G06F 3/041* (2006.01)
*G06F 3/042* (2006.01)
(Continued)

(52) U.S. Cl.
CPC ........ *G06F 3/04164* (2019.05); *G06F 3/0412* (2013.01); *G06F 3/0421* (2013.01); *G06F 3/0446* (2019.05); *G06V 40/1318* (2022.01)

(58) Field of Classification Search
CPC .. G06F 3/04164; G06F 3/0446; G06F 3/0412; G06F 3/0421; G06V 40/1318
(Continued)

(56) References Cited

U.S. PATENT DOCUMENTS

| 4,072,108 A | 2/1978 | Lewis |
|---|---|---|
| 7,996,050 B2 | 8/2011 | Won |

(Continued)

FOREIGN PATENT DOCUMENTS

| CN | 101866228 A | 10/2010 |
|---|---|---|
| CN | 104536638 A | 4/2015 |

(Continued)

*Primary Examiner* — Prabodh M Dharia
(74) *Attorney, Agent, or Firm* — Winston Hsu

(57) ABSTRACT

A control method for an optical fingerprint sensor and a touch controller is provided, for canceling or reducing capacitive loading. The optical fingerprint sensor includes a plurality of pixels, and each of the pixels has a first control signal line and a second control signal line. Each of the pixels is further coupled to a first voltage source line, a second voltage source line and a sensing line. The control method includes the step of configuring at least one of the first control signal line, the second control signal line, the first voltage source line, the second voltage source line and the sensing line to be floating when the touch controller is in a touch operation period.

10 Claims, 13 Drawing Sheets

Related U.S. Application Data which is a continuation-in-part of application No. 16/907,176, filed on Jun. 20, 2020, now Pat. No. 11,295,108, which is a continuation-in-part of application No. 15/086,073, filed on Mar. 31, 2016, now Pat. No. 10,809,855.

(60) Provisional application No. 62/878,291, filed on Jul. 24, 2019, provisional application No. 62/958,255, filed on Jan. 7, 2020, provisional application No. 62/207,366, filed on Aug. 19, 2015.

(51) Int. Cl.
 *G06V 40/13* (2022.01)
 *G06F 3/044* (2006.01)

(58) Field of Classification Search
 USPC ......................................................... 345/173
 See application file for complete search history.

(56) References Cited

U.S. PATENT DOCUMENTS

| | | | |
|---|---|---|---|
| 9,024,913 | B1 | 5/2015 | Jung |
| 9,292,117 | B2 | 3/2016 | Kim |
| 9,542,026 | B2 | 1/2017 | Lee |
| 9,665,208 | B2 | 5/2017 | Kim |
| 9,773,148 | B2 | 9/2017 | Mo |
| 9,841,841 | B2 | 12/2017 | Hwang |
| 2010/0194697 | A1 | 8/2010 | Hotelling |
| 2013/0088470 | A1 | 4/2013 | Chang |
| 2013/0265137 | A1* | 10/2013 | Nelson .............. G06V 40/1306 340/5.82 |
| 2015/0109214 | A1* | 4/2015 | Shi ..................... G06V 40/13 345/173 |
| 2015/0155871 | A1 | 6/2015 | Shin |
| 2015/0179133 | A1 | 6/2015 | Lee |
| 2016/0266695 | A1 | 9/2016 | Bae |
| 2016/0313823 | A1 | 10/2016 | Tan |
| 2016/0334934 | A1 | 11/2016 | Mo |
| 2017/0003791 | A1 | 1/2017 | Berget |
| 2017/0017340 | A1 | 1/2017 | Liu |
| 2017/0024602 | A1* | 1/2017 | Han ..................... G06F 3/0445 |
| 2017/0031524 | A1 | 2/2017 | Shin |
| 2017/0052614 | A1 | 2/2017 | Hsiao |
| 2018/0089487 | A1 | 3/2018 | Kang |
| 2018/0164950 | A1 | 6/2018 | Kang |
| 2019/0014274 | A1 | 1/2019 | Lin |
| 2019/0114030 | A1 | 4/2019 | Shen |
| 2021/0155030 | A1 | 5/2021 | Kurani |

FOREIGN PATENT DOCUMENTS

| | | |
|---|---|---|
| CN | 107077610 A | 8/2017 |
| CN | 107870692 A | 4/2018 |
| CN | 107977122 A | 5/2018 |
| CN | 108984049 A | 12/2018 |
| CN | 109753952 A | 5/2019 |
| CN | 109828694 A | 5/2019 |
| CN | 109964233 A | 7/2019 |
| TW | 201539284 A | 10/2015 |
| TW | M604434 U | 11/2020 |

* cited by examiner

CONTROL METHOD FOR OPTICAL FINGERPRINT SENSOR AND TOUCH CONTROLLER

CROSS REFERENCE TO RELATED APPLICATIONS

This application is a continuation-in-part application of U.S. application Ser. No. 17/107,962, filed on Dec. 1, 2020, which is further a continuation-in-part application of U.S. application Ser. No. 16/907,176, filed on Jun. 20, 2020. U.S. application Ser. No. 16/907,176 is a continuation-in-part application of U.S. application Ser. No. 15/086,073, filed on Mar. 31, 2016, which claims the benefit of U.S. Provisional Application No. 62/207,366, filed on Aug. 19, 2015. U.S. application Ser. No. 16/907,176 further claims the benefit of U.S. Provisional Application No. 62/878,291, filed on Jul. 24, 2019, and U.S. Provisional Application No. 62/958,255, filed on Jan. 7, 2020. The contents of these applications are incorporated herein by reference.

BACKGROUND OF THE INVENTION

1. Field of the Invention

The present invention relates to a control method for an optical fingerprint sensor, and more particularly, to a control method for an optical fingerprint sensor integrated with a touch controller.

2. Description of the Prior Art

Fingerprint recognition technology is widely applied in a variety of electronic products such as a mobile phone, laptop, tablet, personal digital assistant (PDA), and portable electronics, for realizing identity recognition. The fingerprint sensing allows a user to perform identity recognition conveniently, where the user may only need to put his/her finger on a fingerprint sensing pad or area to login the electronic device instead of entering long and tedious username and password.

Among those fingerprint sensing techniques, the optical fingerprint sensing scheme is commonly applied to an electronic product having a display panel. In general, the optical fingerprint sensing may be integrated in a touch panel, so that both the fingerprint sensing and touch sensing operations are feasible in the electronic device. However, the optical fingerprint sensing operation is required to be performed precisely in order to capture tiny peak-to-valley differences of the fingerprint, and it is easily interfered with by the touch sensing operation. Thus, there is a need for improvement over the prior art.

SUMMARY OF THE INVENTION

It is therefore an objective of the present invention to provide a control method for an optical fingerprint sensor integrated with a touch controller, in order to eliminate or reduce the interferences between the touch sensing operation and the fingerprint sensing operation.

An embodiment of the present invention discloses a control method for an optical fingerprint sensor and a touch controller. The optical fingerprint sensor comprising a plurality of pixels, and each of the pixels has a first control signal line and a second control signal line. Each of the pixels is further coupled to a first voltage source line, a second voltage source line and a sensing line, The control method comprises the step of configuring at least one of the first control signal line, the second control signal line, the first voltage source line, the second voltage source line and the sensing line to be floating when the touch controller is in a touch operation period.

Another embodiment of the present invention discloses a control method for a control circuit of an optical fingerprint sensor. The control circuit is integrated with a touch controller and a display driver in a chip. The optical fingerprint sensor comprises a plurality of pixels, and each of the pixels has a first control signal line and a second control signal line. Each of the pixels is further coupled to a first voltage source line, a second voltage source line and a sensing line. The control method comprises the step of applying an anti-loading driving (ALD) signal on at least one of the first control signal line, the second control signal line, the first voltage source line, the second voltage source line and the sensing line when the touch controller is in a touch operation period.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
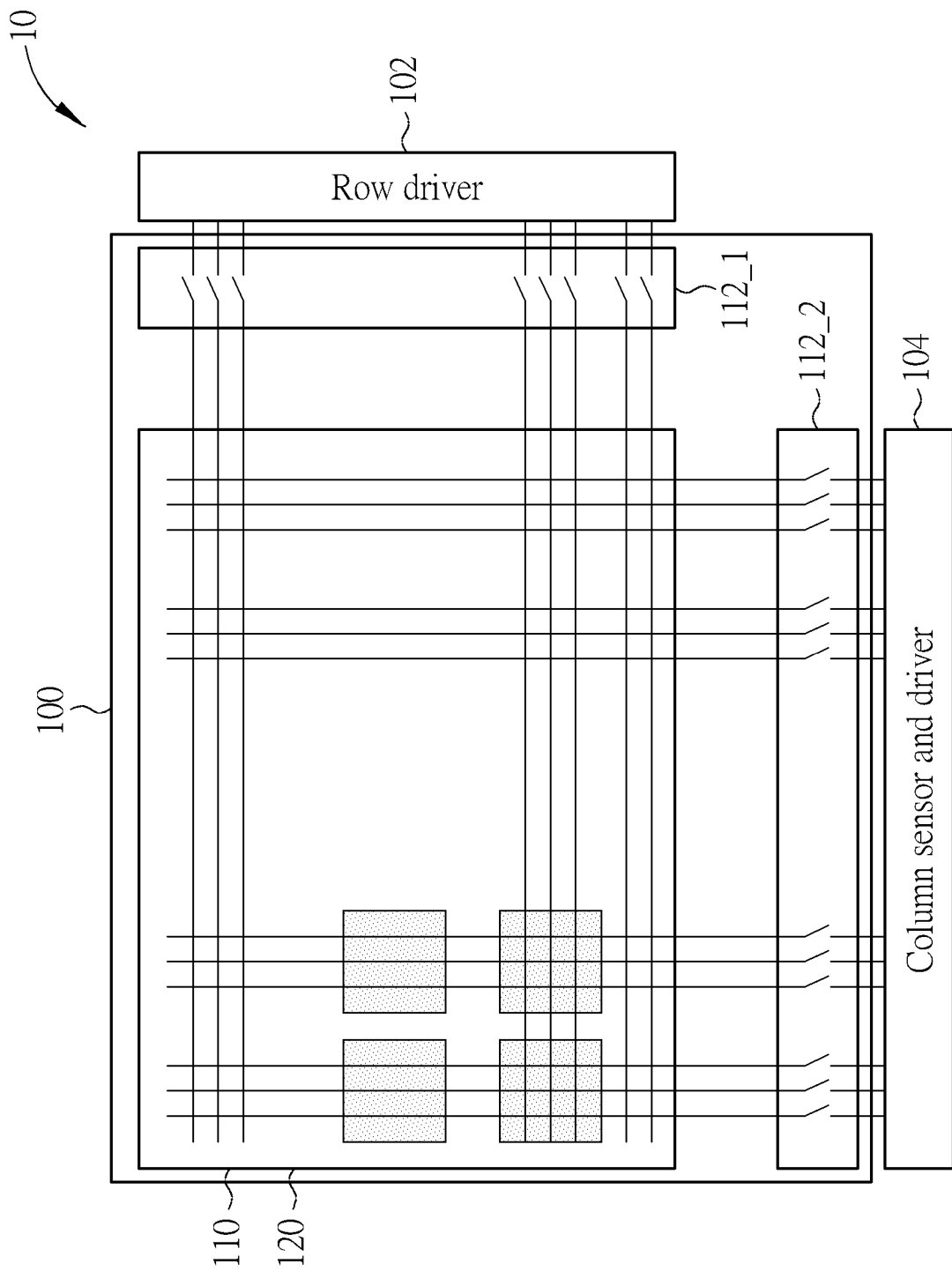
FIG. 1 is a schematic diagram of a display device according to an embodiment of the present invention.

Please refer to FIG. 1, which is a schematic diagram of a display device 10 according to an embodiment of the present invention. As shown in FIG. 1, the display device 10 includes a display panel 100, and a row driver 102 and a column sensor and driver 104. In this embodiment, the display panel 100 may be configured with touch sensing and fingerprint sensing functions; hence, a touch sensing layer 110 having a touch sensor array and a fingerprint sensing layer 120 having a fingerprint sensing pixel array may be superposed on and integrated with the display panel 100. The row driver 102 and the column sensor and driver 104 form a control circuit for the fingerprint sensing pixel array. The display device 10 may further include switch circuits 112_1 and 112_2, each of which may be composed of multiplexers and/or switch circuits, for selectively forwarding the control signals to the target fingerprint sensing pixels in the fingerprint sensing layer 120 or forwarding the sensing signals from the fingerprint sensing pixels to a target receiver circuit in the column sensor and driver 104. The display device 10 may further include control circuits for display and touch sensing, which are omitted herein for brevity.

Figure 2:
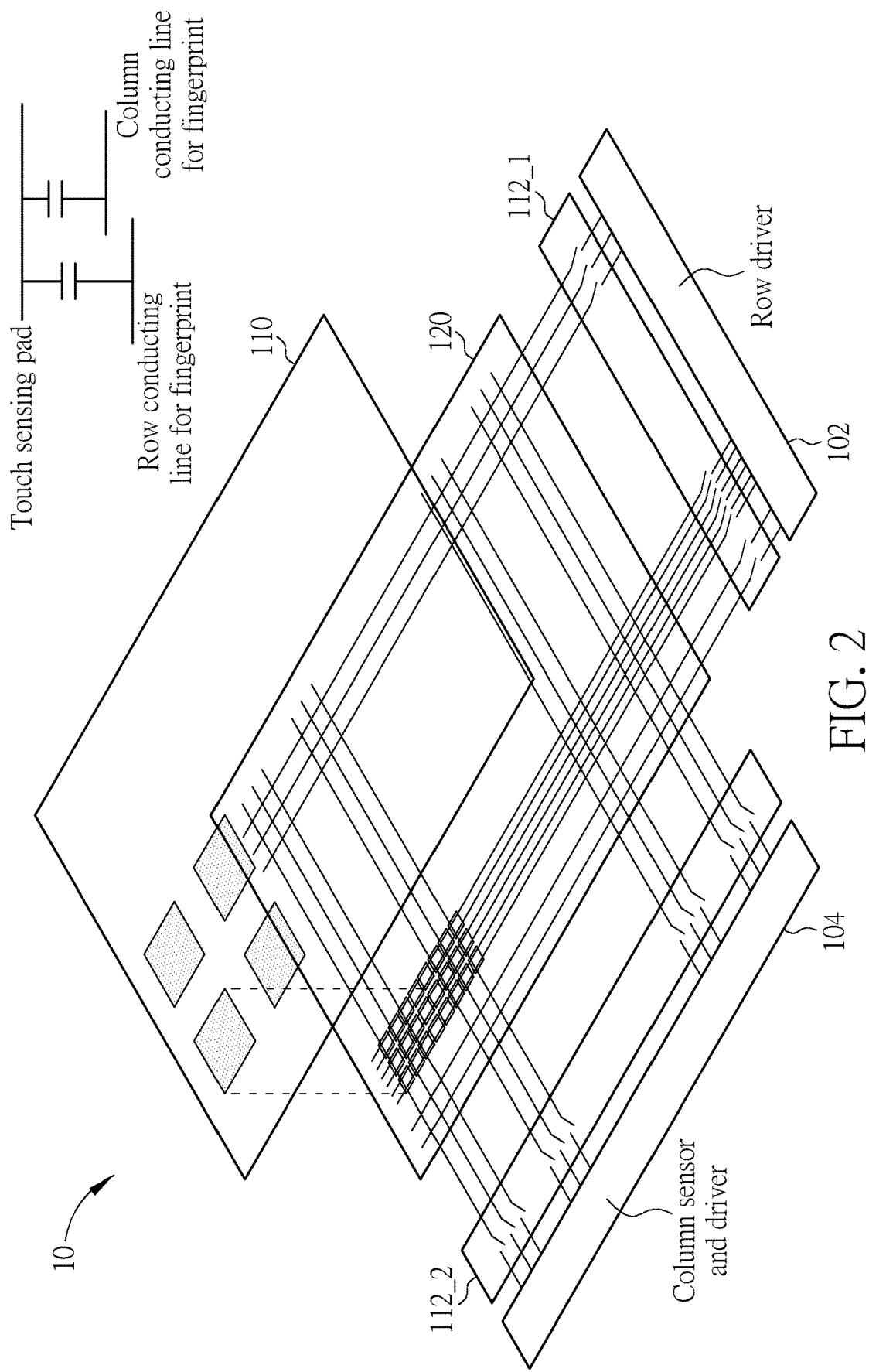
FIG. 2 illustrates a 3-dimensional view of the display device shown in FIG. 1.

FIG. 2 illustrates a 3-dimensional view of the display device 10. In detail, the touch sensing layer 110 includes a touch sensor array, where the touch sensor array has a plurality of sensing pads and a plurality of conducting lines. A touch controller may send touch driving signals to the sensing pads and correspondingly receive touch sensing signals to determine a touch behavior. The touch driving signal may be a periodic signal, which may have any type of pulses such as a sinusoidal wave, square wave, triangular wave or trapezoidal wave. Therefore, the touch sensing signal may also be a corresponding periodic signal carrying the touch sensing information. The fingerprint sensing layer 120 includes a fingerprint sensing pixel array, where each fingerprint sensing pixel may include several circuit elements connected with row and column conducting lines. The row conducting lines are connected to the row driver 102 and the column conducting lines are connected to the columns sensor and driver 104. These conducting lines may include several control signal lines configured to forward control signals, several voltage source lines configured to forward power voltages, and several sensing lines configured to forward fingerprint sensing signals.

As shown in FIG. 2, the touch sensing layer 110 and the fingerprint sensing layer 120 are different layers but close to each other; hence, there is a non-ignorable coupling capacitor existing between each conducting line of the touch sensing pad and each conducting line of the fingerprint sensing pixel. Therefore, if a touch driving signal is sent to the touch sensing pad, the coupling capacitor may couple the touch driving signal or corresponding sensing signal to interfere with the voltages on the control signal lines, the voltage source lines and/or the sensing lines, to generate non-ignorable capacitive loading on the fingerprint sensing operations. From the perspective of the touch sensing operation, the coupling capacitor between the touch sensing layer 110 and the fingerprint sensing layer 120 may also affect the sensing signal of the touch operation.

In this embodiment, the touch sensing layer 110 is the upper layer superposed on the fingerprint sensing layer 120. In another embodiment, the fingerprint sensing layer may be the upper layer and the touch sensing layer may be the lower layer. Alternatively, the touch sensor and/or fingerprint sensor may be disposed in multiple layers. The panel structure should not be a limitation to the scope of the present invention.

Figure 3:
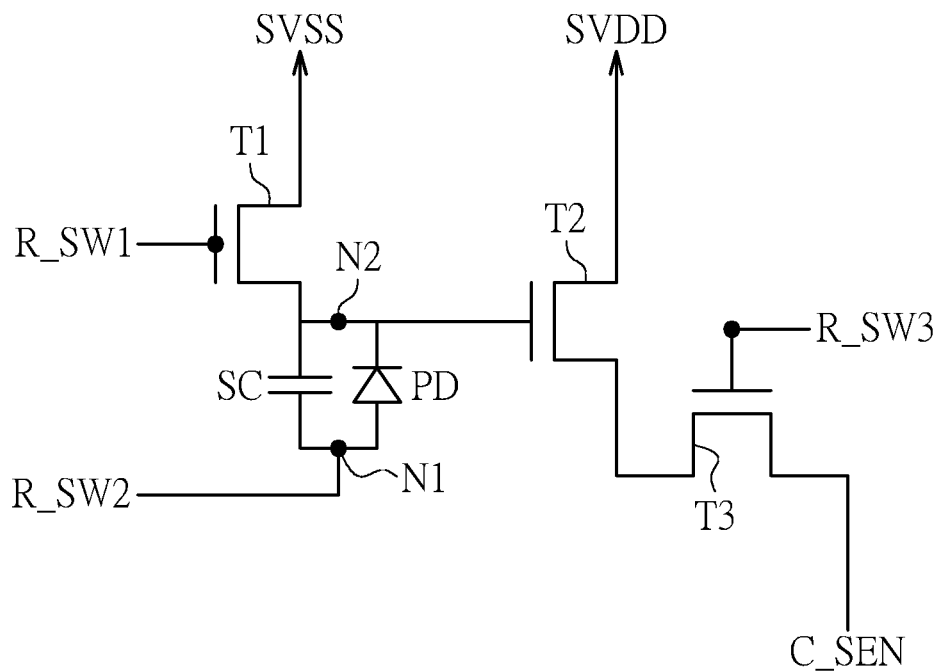
FIG. 3 illustrates a detailed structure of a fingerprint sensing pixel included in the fingerprint sensing layer shown in FIGS. 1 and 2.

FIG. 3 illustrates a detailed structure of a fingerprint sensing pixel included in the fingerprint sensing layer 120 shown in FIGS. 1 and 2. In this embodiment, the fingerprint sensing pixel, which is configured to realize an optical fingerprint sensor, includes an optoelectronic element PD, a storage capacitor SC and three transistors T1-T3. The fingerprint sensing pixel may operate by receiving a first power voltage through a first voltage source line SVSS and a second power voltage through a second voltage source line SVDD. In an embodiment, the first power voltage may be a negative power voltage or a ground voltage or a positive power voltage, and the second power voltage may be a negative power voltage or a ground voltage or a positive power voltage. The actual polarity arrangement of the voltage source lines may be determined based on the circuit design of the sensing pixels, and the present invention is not limited herein. Three row control signals are sent to the pixel through control signal lines R_SW1-R_SW3, respectively, allowing the pixel to output a sensing signal through a sensing line C_SEN. In another embodiment, the fingerprint sensing pixels are used to implement an optical fingerprint sensor, which includes an optoelectronic element PD, a storage capacitor SC and two transistors T1-T2, making the circuit structure more simplified.

In the fingerprint sensing pixel, the optoelectronic element PD may be a photodiode, which is configured to sense light and convert the sensed light intensity into an electronic signal (such as a voltage signal or current signal), and the operation is called "exposure". During the exposure period, the electronic signal may flow into the storage capacitor SC to be stored in the storage capacitor SC. The transistor T1 may be served as a reset transistor, for resetting the voltage at the node N2 (i.e., reset the electric charges stored in the storage capacitor SC) before the exposure operation. The transistor T2 may be served as a source follower, for forwarding the electronic signal sensed by the optoelectronic element PD and stored in the storage capacitor SC to the sensing line C_SEN after the exposure operation is complete. The transistor T3 may be served as a select transistor, which may be turned on by the corresponding control signal when this pixel is selected.

As shown in FIG. 3, the transistor T1 has a gate terminal, a first terminal and a second terminal, where the gate terminal is coupled to the control signal line R_SW1 to receive a control signal such as a reset signal, the first terminal is coupled to the first voltage source line SVSS, and the second terminal is coupled to the optoelectronic element PD and the storage capacitor SC. Note that the first terminal of the transistor T1 may be one of the drain terminal and the source terminal and the second terminal of the transistor T1 may be the other one, based on the current flow direction of the transistor T1. Each of the optoelectronic element PD and the storage capacitor SC has a first terminal and a second terminal, where the first terminal is coupled to the control signal line R_SW2 to receive a control signal such as a bias voltage, and the second terminal is coupled to the second terminal of the transistor T1. The transistor T2 has a gate terminal, a first terminal and a second terminal, where the gate terminal is coupled to the second terminal of the transistor T1, the second terminal of the optoelectronic element PD, and the second terminal of the storage capacitor SC, the first terminal is coupled to the second voltage source line SVDD, and the second terminal is coupled to the transistor T3. Note that the first terminal of the transistor T2 may be one of the drain terminal and the source terminal and the second terminal of the transistor T2 may be the other one, based on the current flow direction of the transistor T2. The transistor T3 has a gate terminal, a first terminal and a second terminal, where the gate terminal is coupled to the control signal line R_SW3 to receive a control signal such as a select signal, the first terminal is coupled to the second terminal of the transistor T2, and the second terminal is coupled to the sensing line C_SEN. Note that the first terminal of the transistor T3 may be one of the drain terminal and the source terminal and the second terminal of the transistor T3 may be the other one, based on the current flow direction of the transistor T3.

Figure 4:
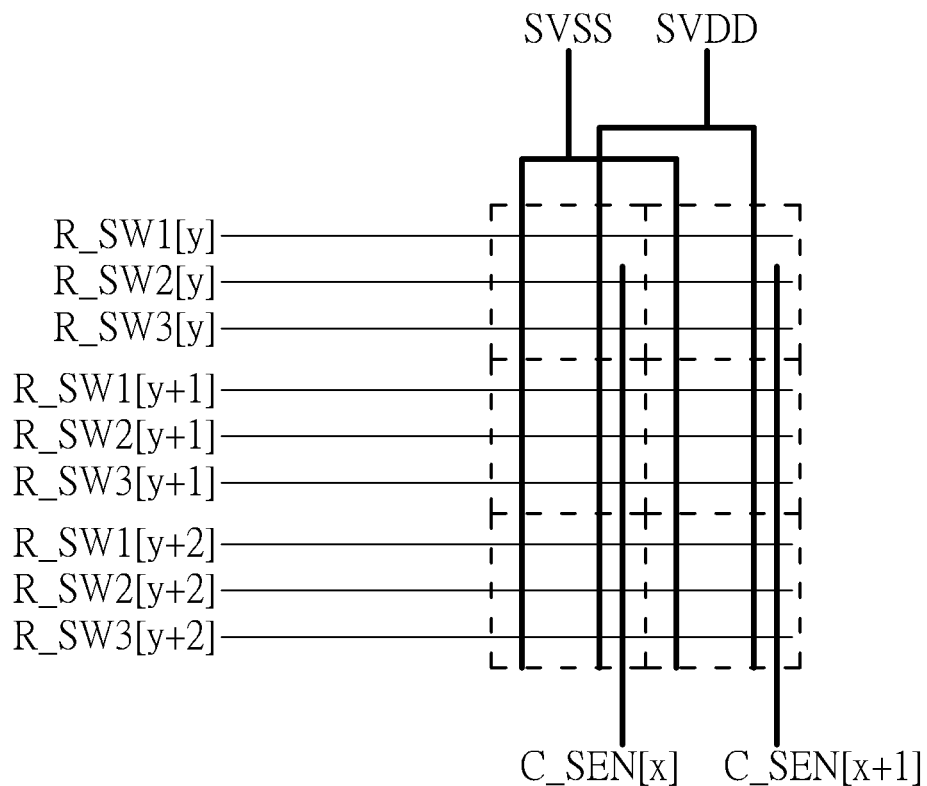
FIG. 4 is a schematic diagram of deployment of the control signal lines, the sensing line and the voltage source lines in the fingerprint sensing pixel array.

Please refer to FIG. 4, which is a schematic diagram of deployment of the control signal lines R_SW1-R_SW3, the sensing line C_SEN and the voltage source lines SVSS and SVDD in the fingerprint sensing pixel array. Considering FIG. 4 together with FIG. 1, each control signal line R_SW1-R_SW3 may be coupled to a row of pixels, and each sensing line C_SEN may be coupled to a column of pixels. Each voltage source line SVSS or SVDD is coupled to the pixels through a connecting line in the column direction. Therefore, the control signal lines R_SW1-R_SW3 may be coupled to the row driver 102, which is configured to send the corresponding control signals. The sensing line C_SEN may be coupled to the column sensor and driver 104, which is configured to receive the fingerprint sensing signals. Since the control signal lines R_SW1-R_SW3, the sensing line C_SEN, and the voltage source lines SVSS and SVDD are spread over the fingerprint sensing layer 120, all of these lines may be interfered with by the touch driving/sensing signals applied to the touch sensing layer 110.

According to the optical fingerprint sensing operations, the electronic signal generated by the optoelectronic element PD is stored in the storage capacitor SC; hence, it is preferable to prevent or reduce the capacitive loading on both terminals of the storage capacitor SC, i.e., the nodes N1 and N2, where the capacitive loading may be generated from the touch driving or sensing signal of the touch sensing pad. For example, if a coupling capacitor exists between the node N1 in the fingerprint sensing pixel and the touch sensing pad in the touch sensing layer 110, the touch driving or sensing signal applied to the touch sensing pad may generate an interference to change the electronic signal stored in the storage capacitor SC, resulting in an error on the generated fingerprint sensing signal. In order to cancel or reduce the capacitive loading, an anti-loading driving (ALD) signal may be applied to the lines on the fingerprint sensing layer 120 or the lines may be configured to be floating when the touch driving signal is sent to the touch sensing layer 110. When the touch controller is in a touch operation period, at least one of the control signal lines R_SW1-R_SW3, the voltage source lines SVSS and SVDD, and the sensing line C_SEN is applied with an ALD signal, and any other line not applied with the ALD signal is configured to be floating. In another embodiment, when the touch controller is in a touch operation period, all the control signal lines R_SW1-R_SW3, the voltage source lines SVSS and SVDD, and the sensing line C_SEN may be configured to be floating. In a further embodiment, at least one of the control signal lines R_SW1-R_SW3, the voltage source lines SVSS and SVDD, and the sensing line C_SEN may be configured to be floating, while other lines not configured to be floating may be applied with a direct current (DC) voltage, or may be applied with the ALD signal. A signal line is floating if a switch at the signal source is turned off or the signal source outputs high impedance, and the present invention is not limited herein. In short, by applying the ALD signals or making the signal lines floating, or using various permutations and combinations of these two technical means, the interferences of signal coupling between the touch controller and the fingerprint sensor may be minimized.

Figure 5A:
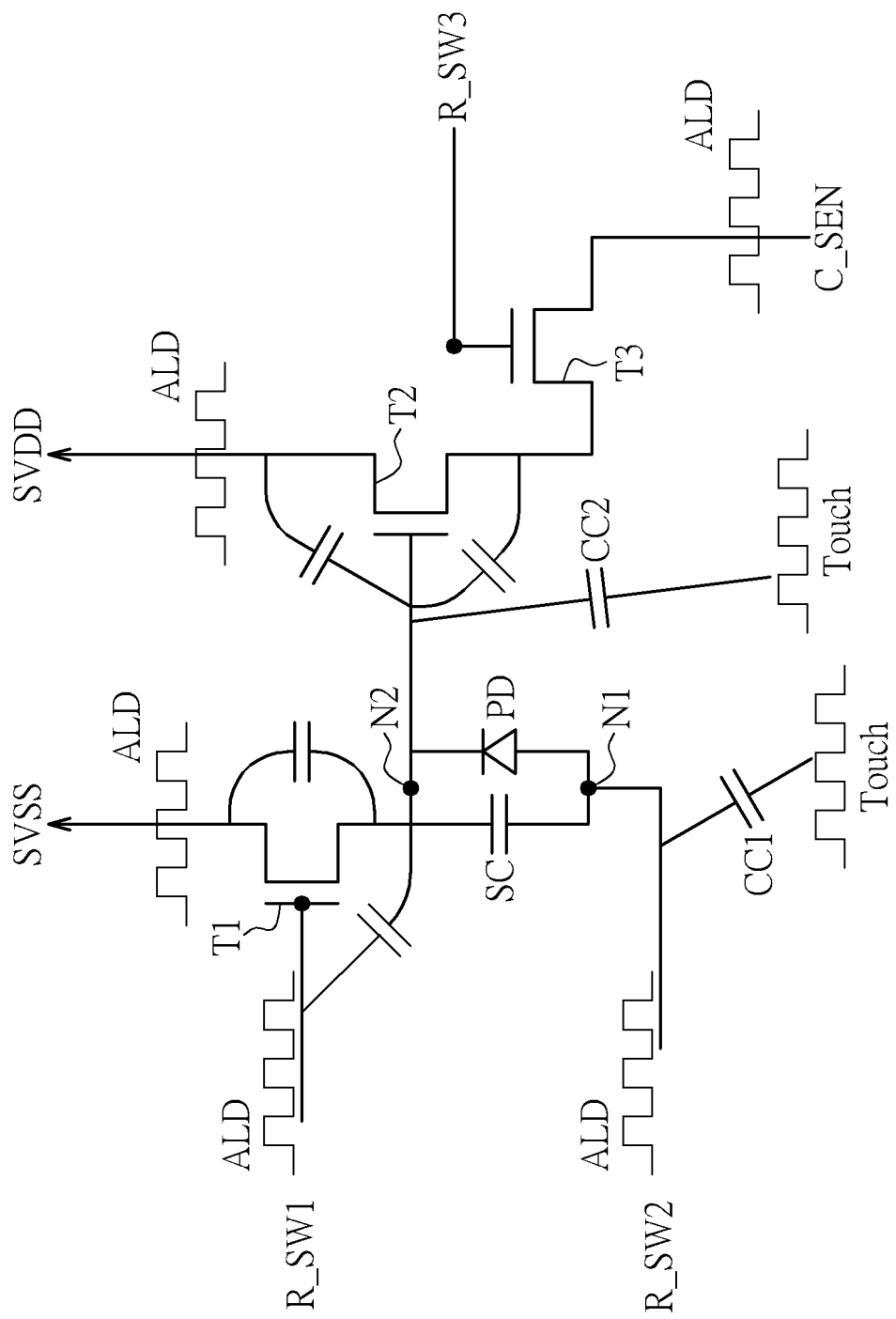
FIG. 5A is a schematic diagram of applying the ALD signal to the fingerprint sensing pixel.

Please refer to FIG. 5A, which is a schematic diagram of applying the ALD signal to the fingerprint sensing pixel. In detail, a first ALD signal may be applied on the control signal line R_SW2. Since the control signal line R_SW2 is directly coupled to the node N1, the first ALD signal may be sent to the node N1 to cancel or reduce the capacitive loading at the first terminal of the storage capacitor SC. In order to cancel or reduce the capacitive loading at the second terminal of the storage capacitor SC, a second ALD signal may be sent to the node N2. Since the node N2 is coupled to the transistors T1 and T2, the second ALD signal may be applied on any one or more of the lines connected to the transistor T1 and/or 12. These lines include, but not limited to, the control signal line R_SW1, the first voltage source line SVSS, the second voltage source line SVDD and the sensing line C_SEN. If the second ALD signal is applied on the control signal line R_SW1 and/or the first voltage source line SVSS, this second ALD signal may be coupled to the node N2 through the parasitic capacitor (s) of the transistor T1. If the second ALD signal is applied on the second voltage source line SVDD and/or the sensing line C_SEN, this second ALD signal may be coupled to the node N2 through the parasitic capacitor(s) of the transistor T2.

Please note that the ALD signals aim at canceling or reducing the capacitive loading of the fingerprint sensing pixel. Preferably, an ALD signal may be exactly identical to the touch driving signal sent to the touch sensing pad, as shown in FIG. 5A. The touch driving signal may interfere with the fingerprint sensing pixel through capacitive coupling of the coupling capacitors CC1 and CC2. Without the ALD signal, when the touch driving signal toggles, the voltage variation of the touch driving signal may cause the coupling capacitors CC1 and CC2 to perform charging or discharging, resulting in an unpredictable voltage variation on the node N1 and/or N2. If the ALD signals exactly identical to the touch driving signal are applied to the nodes N1 and N2 while the touch driving signal toggles, the cross voltages of the coupling capacitors CC1 and CC2 may keep constant, which means that the coupling capacitors CC1 and CC2 may not perform charging or discharging, and thus may not influence the electronic signal stored in the storage capacitor SC.

As mentioned above, the touch driving signal may be a periodic signal having a plurality of pulses. Therefore, the ALD signal may also be a modulation signal with multiple pulses where the frequency, phase, and amplitude of the pulses are substantially identical to the frequency, phase, and amplitude of the pulses of the touch driving signal. Since the touch driving signal may have any type of pulses such as sinusoidal wave, square wave, triangular wave or trapezoidal wave, the ALD signal may be modulated to have the same or similar type of pulses.

Please note that an ALD signal may be or may not be exactly the same as the touch signal such as the touch driving signal or touch sensing signal. For example, in an embodiment, the amplitude of the ALD signal may be slightly smaller than the amplitude of the touch driving signal, while their frequencies and phases are substantially identical. Alternatively or additionally, the phase of the ALD signal may have a small shift from the phase of the touch driving signal, while their frequencies are substantially identical. The higher similarity between the ALD signal and the touch signal may generate higher performance of reducing the capacitive loading of the fingerprint sensing pixel.

The ALD signals may be applied on the lines of the fingerprint sensing pixel in any manner. In an embodiment, an ALD signal may be applied to a target line by driving the target line with the ALD signal, where the ALD signal may be substantially identical to the touch signal (with identical frequency, phase and/or amplitude). Alternatively or additionally, an ALD signal may be applied to a switch of a target line to control the corresponding node to be floating. In this implementation, the ALD signal may have any possible pattern. For example, the ALD signal may be a periodic signal having any type of pulses as described above, or may be a signal in an appropriate voltage level that may turn off the corresponding switch. As long as the switch may be turned off by the ALD signal to let the target node to be floating for a period of time, this ALD operation may be feasible. The floating status allows the voltage of the target node to shift upward or downward following the pulses in the touch signal due to the coupling capacitor CC1 or CC2. A node may be floating when every terminal of this node is only connected to high impedance node(s), or any external connection of this node is cut off; that is, all switches connected to the node are turned off. The floating operation may be applied for the sake of power saving or if it is not feasible to drive the target line with a signal. The target line that receives the ALD signal may be the control signal line R_SW2 coupled to the node N1, and/or any other possible lines coupled to the pixel, such as the control signal lines R_SW1 and R_SW3, the first voltage source line SVSS, the second voltage source line SVDD and the sensing line C_SEN.

Figure 5B:
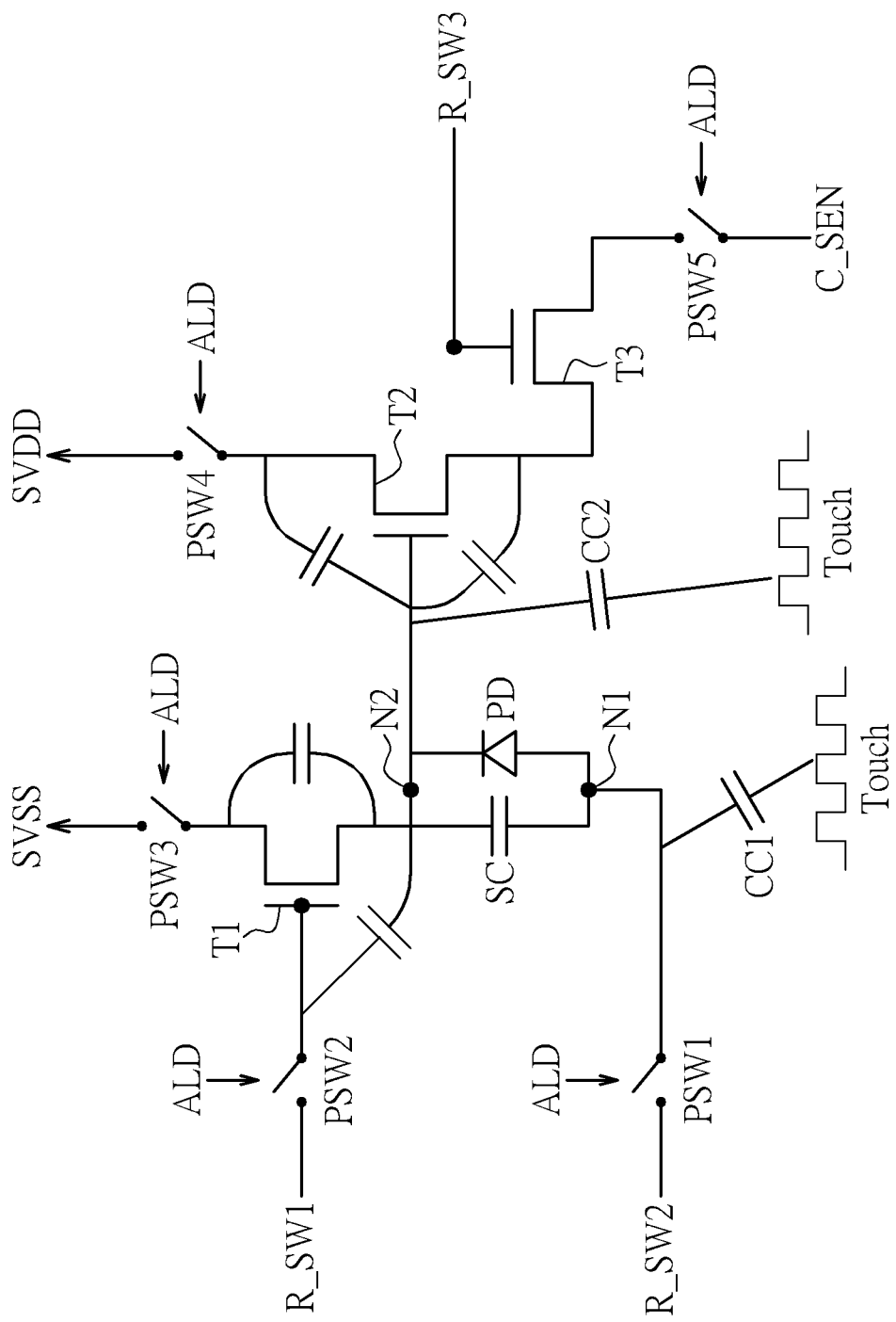
FIG. 5B illustrates a detailed implementation of applying the ALD signal to control the nodes to be floating.

FIG. 5B illustrates a detailed implementation of applying the ALD signal to control the nodes to be floating. The pixel structure shown in FIG. 5B is similar to the pixel structure shown in FIG. 5A, so signals and elements having similar functions are denoted by the same symbols. The structure of FIG. 5B further includes switches PSW1-PSW5 respectively coupled to the control signal line R_SW2, the control signal line R_SW1, the first voltage source line SVSS, the second voltage source line SVDD and the sensing line C_SEN. Note that each of the switches PSW1-PSW5 may be a switch dedicated to the target pixel, or may be a switch of the target line for connecting to a row or column of pixels. In another embodiment, the signal line is configured to be in a floating status by turning off the switch at the signal source or making the signal source output high impedance, or all the above signal lines may be connected together and controlled by a master switch. The present invention is not limited thereto.

In detail, in order to apply the ALD signal to the fingerprint sensing pixel, a first ALD signal may be applied to the switch PSW1. In such a situation, the switch PSW1 coupled between the node N1 and the control signal line R_SW2 may be turned off, so as to control the node N1 to be floating. Further, in order to control the node N2 to be floating, a second ALD signal may be applied to any one or more of the switch PSW2 coupled to the control signal line R_SW1, the switch PSW3 coupled to the first voltage source line SVSS, the switch PSW4 coupled to the second voltage source line SVDD, and the switch PSW5 coupled to the sensing line C_SEN. In such a situation, any nodes of the pixel coupled to the control signal line R_SW1, the first voltage source line SVSS, the second voltage source line SVDD and the sensing line C_SEN may be floating, and thus the node N2 may be floating.

As for the fingerprint sensing pixel array in the fingerprint sensing layer 120, the ALD signals may be implemented flexibly by applying the methods of driving with the ALD signal and/or controlling the node to be floating to each pixel. For example, the lines of a first pixel may be driven with an ALD signal while the lines of a second pixel may be controlled by the ALD signal to let the corresponding node(s) to be floating. The ALD signals for a fingerprint sensing pixel array with 2 columns (Col1 and Col2) and 2 rows (Row1 and Row2) may have various implementations described as Table 1, as shown below:

TABLE 1

| Case | Touch element | Fingerprint sensing pixel | | | |
|---|---|---|---|---|---|
| | | Row1 | Row2 | Col1 | Col2 |
| 1 | Driving | Driving | Driving | Driving | Driving |
| 2 | Driving | Driving | Floating | Floating | Floating |
| 3 | Driving | Floating | Driving | Floating | Floating |
| 4 | Driving | Floating | Floating | Driving | Floating |
| 5 | Driving | Floating | Floating | Floating | Driving |
| 6 | Driving | Driving | Driving | Floating | Floating |
| 7 | Driving | Driving | Floating | Driving | Floating |
| 8 | Driving | Driving | Floating | Floating | Driving |
| 9 | Driving | Floating | Driving | Driving | Floating |
| 10 | Driving | Floating | Driving | Floating | Driving |
| 11 | Driving | Floating | Floating | Driving | Driving |
| 12 | Driving | Driving | Driving | Driving | Floating |
| 13 | Driving | Driving | Driving | Floating | Driving |
| 14 | Driving | Driving | Floating | Driving | Driving |
| 15 | Driving | Floating | Driving | Driving | Driving |
| 16 | Driving | Floating | Floating | Floating | Floating |

According to Table 1, there may be at least 16 different implementations of the ALD signals for the pixel array, and the ALD signals may be applied when the touch driving signal is sent to the touch element. Note that a general fingerprint sensing pixel array may include more than 2 rows and 2 columns of pixels, and thus more combinations of driving and floating operations may be feasible. In an embodiment, the ALD signals for different lines connected to the same row of pixels and/or different lines connected to the same column of pixels may further be implemented in different manners, so as to realize the flexibility of ALD operations.

In an embodiment, the ALD signals and the floating control may be selectively performed on several of the lines of a fingerprint sensing pixel. For example, when a first control signal line has heavier loading, the first control signal line may be controlled to be floating when the touch controller is in the touch operation period. When a second control signal line has lighter loading, the second control signal may be applied with a DC voltage or any other voltage signal based on the requirements of circuit operations, while the first control signal line is in the floating status.

Figure 5C:
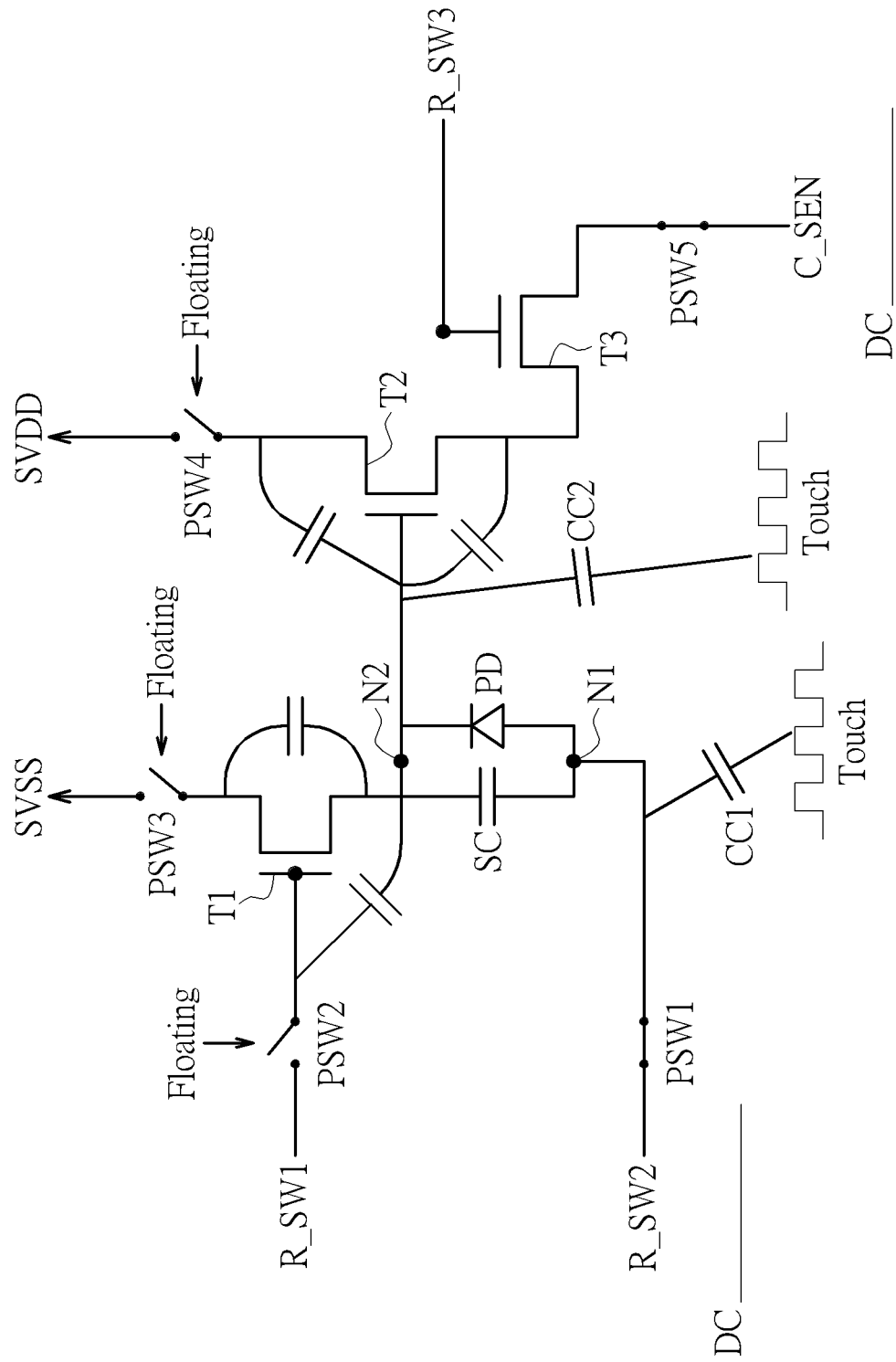
FIG. 5C illustrates an exemplary implementation of controlling several lines to be floating while applying the DC voltage to other lines.

FIG. 5C illustrates an exemplary implementation of controlling several lines to be floating while applying the DC voltage to other lines. The pixel structure shown in FIG. 5C is similar to the pixel structure shown in FIG. 5B, so signals and elements having similar functions are denoted by the same symbols. In this embodiment, during the touch operation period of the touch controller, the first voltage source line SVSS, the second voltage source line SVDD and the control signal line R_SW1 are configured to be floating, and the control signal line R_SW2 and the sensing line C_SEN are applied with the DC voltage. In such a situation, the capacitive loading on the first voltage source line SVSS, the second voltage source line SVDD and the control signal line R_SW1 may be reduced or canceled, and the control signal line R_SW2 and the sensing line C_SEN may receive the DC voltage or any other voltage signal to satisfy the operational requirements.

In the above embodiments, the switch corresponding to any of the control signal lines R_SW1-R_SW2, the first voltage source line SVSS, the second voltage source line SVDD and the sensing line C_SEN is applied with a control signal to control the corresponding line to be floating. The control signal may be an ALD signal or a digital signal. In fact, any feasible signal capable of realizing the floating control should be applicable to the present invention.

Figure 6:
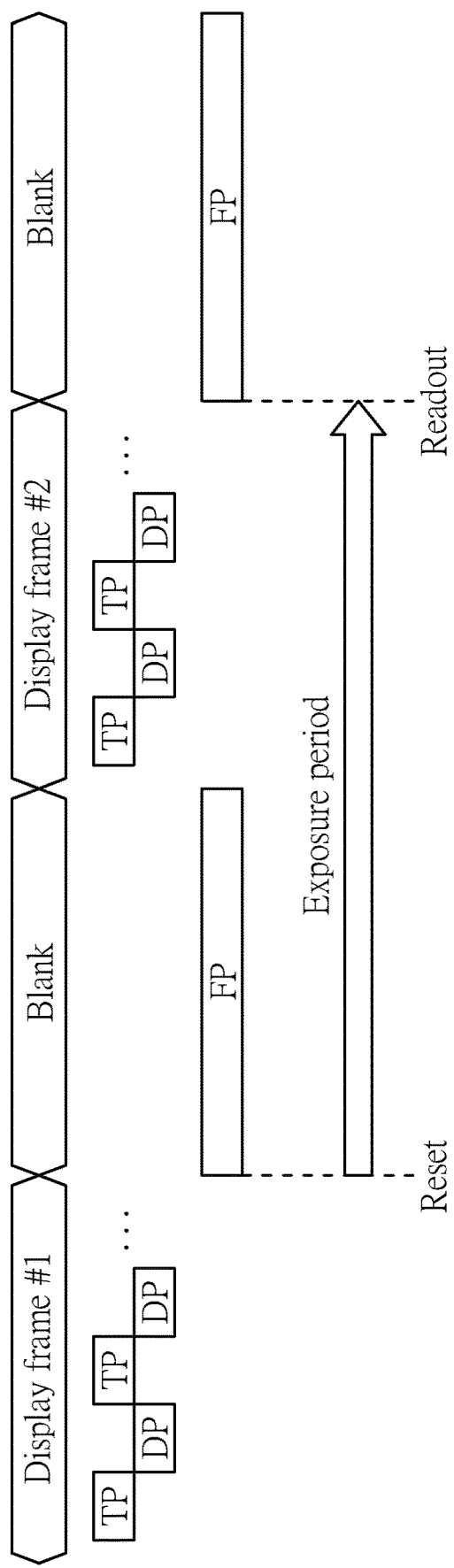
FIG. 6 is a timing diagram of operations of a display device according to an embodiment of the present invention.

Please refer to FIG. 6, which is a timing diagram of operations of a display device according to an embodiment of the present invention. In order to reduce the interferences between display, touch sensing, and fingerprint sensing operations, these operations may be performed based on time division. As shown in FIG. 6, the touch operation period (TP) and the display period (DP) may be configured alternately in the display time for each frame, and the fingerprint sensing period (FP) may be configured in the blank time between two consecutive display frames. Considering FIG. 6 together with FIG. 3, the operations of optical fingerprint sensor require that the node N2 is reset to a predetermined voltage level, then exposure starts, and then the electronic signal generated in the exposure procedure is read out at the end of the exposure period. In general, the exposure period may persist for a frame of display cycle including several display periods and touch operation periods, as shown in FIG. 6. In another embodiment, the exposure period may cross several display frames in order to generate enough sensing signals.

During the exposure period, the electronic signals of the optoelectronic element PD may continuously be generated and accumulated in the storage capacitor SC, and the voltage on the node N2 may change correspondingly. Therefore, the ALD signal may be applied during the exposure period, in order to prevent the electric charges stored in the storage capacitor SC (i.e., the voltage across the storage capacitor SC) from being interfered with by the touch signals before the fingerprint sensing signal is read out.

Figure 7:
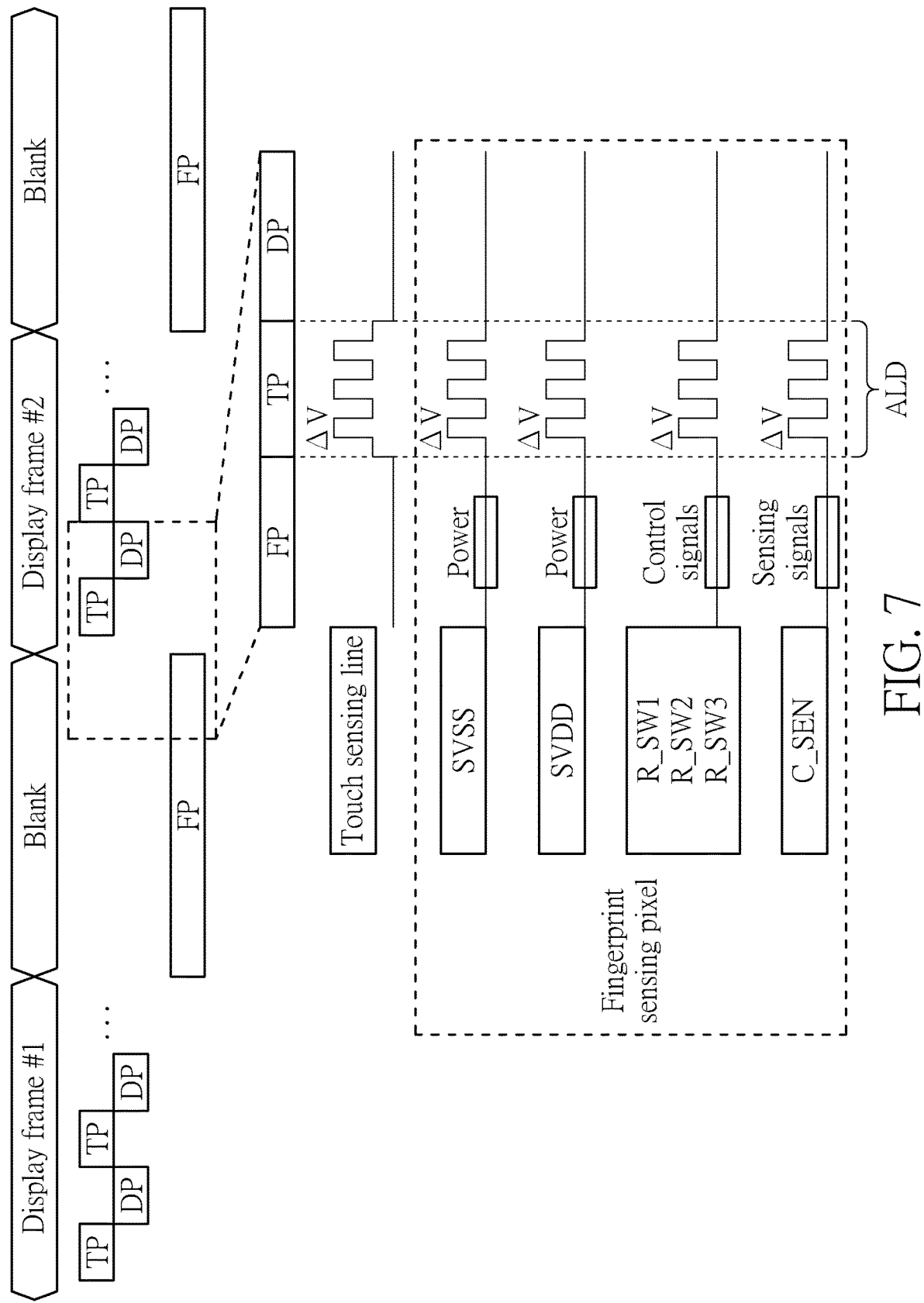
FIG. 7 illustrates a detailed implementation of the ALD signal during a touch operation period.

More specifically, the touch operation may be performed during the touch operation periods; that is, the touch driving signals may usually toggle in the touch operation periods. Therefore, the ALD signal may be applied during the touch operation periods. FIG. 7 illustrates a detailed implementation of the ALD signal during a touch operation period. As shown in FIG. 7, a touch sensing line may receive a touch signal from a sensing pad during the touch operation period, the touch signal having square-wave pulses with an amplitude equal to $\Delta V$. Therefore, the ALD operation may be applied to the fingerprint sensing pixels during the touch operation period, where the ALD signals may have the same amplitude $\Delta V$. As mentioned above, sometimes several of the lines are applied with the ALD signal and other lines are applied with a DC voltage. In an embodiment, the ALD signal may be implemented as a pulse signal with amplitude $\Delta V$ carried on a DC voltage; that is, the pulse signal with amplitude $\Delta V$ is a portion of the ALD signal not including the DC voltage.

In this embodiment, the first voltage source line SVSS and the second voltage source line SVDD may forward a power voltage during the fingerprint sensing period and the display period, and forward the ALD signal during the touch operation period, where the ALD signal may include multiple pulses generated by modulating the power voltage, and the pulses have substantially identical frequency, phase and amplitude as the touch signal applied to the touch sensing line. The control signal lines R_SW1-R_SW3 may forward corresponding control signals during the fingerprint sensing period and the display period, and forward the ALD signal during the touch operation period, where the ALD signal may include multiple pulses generated by modulating the control signals, and the pulses have substantially identical frequency, phase and amplitude as the touch signal applied to the touch sensing line. The sensing line C_SEN may forward the sensing signal during the fingerprint sensing period, and forward the ALD signal during the touch operation period, where the ALD signal may include multiple pulses, and the pulses have substantially identical frequency, phase and amplitude as the touch signal applied to the touch sensing line.

Figure 8:
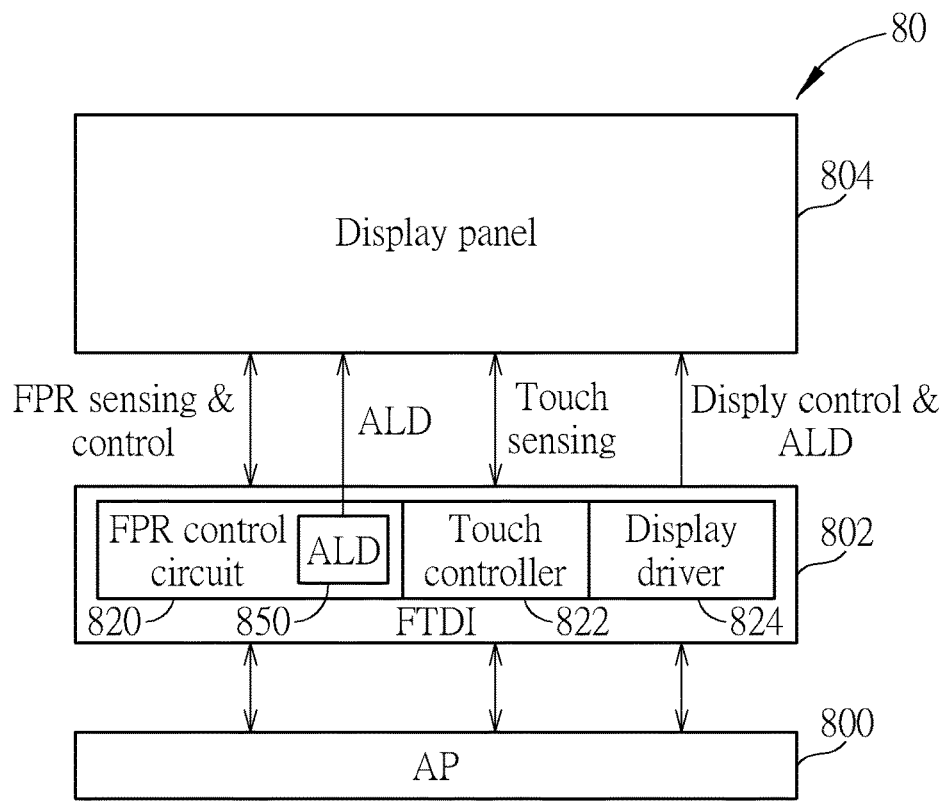
FIG. 8 is a schematic diagram of a display system according to an embodiment of the present invention.

Please refer to FIG. 8, which is a schematic diagram of a display system 80 according to an embodiment of the present invention. As shown in FIG. 8, the display system 80 includes a system processor (AP) 800, a fingerprint, touch and display integration (FTDI) circuit 802 and a display panel 804, where the FTDI circuit 802 may be a single chip integrated with processing circuits for display, touch and fingerprint sensing operations. In detail, the system processor 800 may be a core processor of the display system 80, such as a central processing unit (CPU), a microcontroller unit (MCU), a microprocessor, or the like. As for a smart phone, the system processor 800 may be an MCU configured to control various applications and operations of the smart phone. Note that the algorithm for fingerprint recognition is usually quite complex, such that fingerprint matching and determination should be performed in the system processor 800 having larger computation resources and may not be realized in the FTDI circuit 802. The FTDI circuit 802 aims at capturing or extracting the fingerprint image received from the display panel 804, and processing the received fingerprint sensing signals to amplify and acquire the desired peak-to-valley data. In an embodiment, the FTDI circuit 802 is an integrated circuit implemented in one chip, in which the control circuit of the optical fingerprint sensor, the touch controller, and the display driver of the display panel 804 are integrated.

The display panel 804 may be the display panel 100 shown in FIG. 1, where the touch sensing layer 110 and the fingerprint sensing layer 120 are included, for realizing the three-in-one integration of display, touch and fingerprint sensing operations. The FTDI circuit 802 may be served as a control circuit for controlling the display, touch and fingerprint sensing operations of the display panel 804. In an embodiment, the display panel 804 may be an in-cell touch and fingerprint panel, where the touch sensor and fingerprint sensor and their related connecting lines are disposed inside the display panel 804; hence, the distance between the touch sensing layer 110 and the fingerprint sensing layer 120 may be quite near, and thus the coupling capacitors between the touch sensing layer 110 and the fingerprint sensing layer 120 may generate severe loading on the fingerprint sensing operation.

As shown in FIG. 8, a fingerprint (FPR) control circuit 820, a touch controller 822 and a display driver 824 may be integrated in the FTDI circuit 802, and each of these modules communicates with the system processor 800 through a specific interface. The FTDI circuit 802 may further include an ALD circuit 850, which may be selectively implemented in the touch controller 822 or the fingerprint control circuit 820 (as an example shown in FIG. 8, the ALD circuit 850 is implemented in the fingerprint control circuit 820). The fingerprint control circuit 820, which may include a row driver (and/or sensor) and a column driver (and/or sensor) as shown in FIG. 1, may send control signals to control the fingerprint sensing pixels in the display panel 804, allowing the pixels to send fingerprint sensing signals in a specific sequence. The fingerprint control circuit 820 may also include a readout circuit configured to receive the sensing signals from each fingerprint sensing pixel. The touch controller 822 is configured to send touch driving signals to the touch sensing pad in the touch sensing layer of the display panel 804 and correspondingly receive touch sensing signals. The display driver 824 is configured to perform display control of the display panel 804. Specifically, the display driver 824 may receive image data from the system processor 800, and correspondingly generate and output image signals to the display panel 804.

In order to realize the ALD operation, in the touch operation period and/or the exposure period, the ALD circuit 850 of the FTDI circuit 802 may further be configured to drive the line(s) of the fingerprint sensing pixel with the ALD signal, or control the corresponding node(s) of the fingerprint sensing pixel to be floating. In an embodiment, the ALD circuit 850 implemented in the fingerprint control circuit 820 may apply the ALD signal according to a notification received from the touch controller 822, allowing the ALD signal to be synchronized with the touch signal, so that the ALD signal and the touch signal may be configured to have identical frequency and phase, and/or amplitude. The notification may be in any form such as a flag, a voltage level, or a toggle in a connecting line between the fingerprint control circuit 820 and the touch controller 822.

In addition to the fingerprint control circuit 820, the display driver 824 may also apply an ALD signal on the display circuits of the display panel 804 during the touch operation period. This may prevent or reduce the capacitive loading of the display circuits caused by the coupling capacitors between the display pixels and the touch sensing layer.

Figure 9:
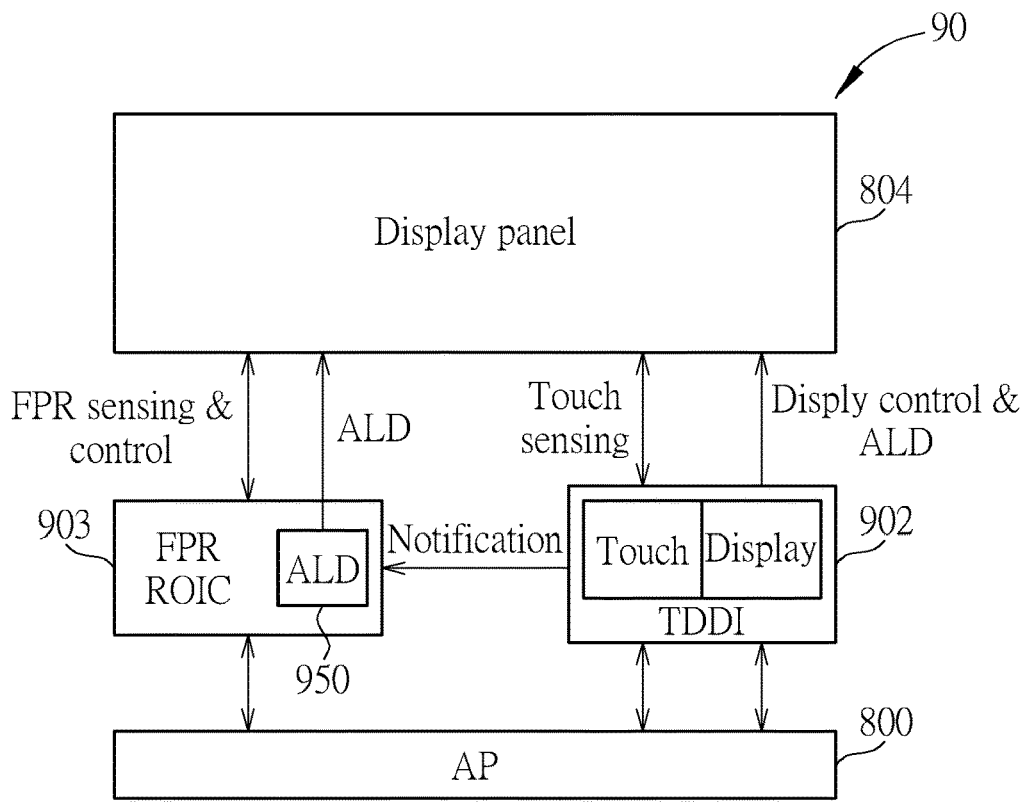
FIG. 9 is a schematic diagram of another display system according to an embodiment of the present invention.

Please note that the implementation of the FTDI circuit 802 shown in FIG. 8 is one of various embodiments of the present invention. In another embodiment, the circuitry for controlling the display panel may be implemented in a 2-chip scheme. Please refer to FIG. 9, which is a schematic diagram of another display system 90 according to an embodiment of the present invention. The circuit structure of the display system 90 is similar to the circuit structure of the display system 80, so signals and elements having similar functions are denoted by the same symbols. As shown in FIG. 9, the display system 90 is different from the display system 80 in that, the display system 90 includes a touch and display driving integration (TDDI) circuit 902 and a fingerprint readout circuit (FPR ROIC) 903, which replace the functions of the FTDI circuit 802 in the display system 80. The FPR ROIC 903 may have an ALD circuit 950. The FPR ROIC 903 is configured to read out fingerprint sensing signals from the fingerprint sensing pixels, and also configured to apply the ALD signals to the lines of the fingerprint sensing pixels by the ALD circuit 950. Each of the TDDI circuit 902 and the FPR ROIC 903 may be implemented as the integrated circuit in a chip, and these two chips cooperate to control the display, touch sensing and fingerprint sensing operations of the display panel 804. An interface is disposed between the TDDI circuit 902 and the FPR ROIC 903, for forwarding necessary messages such as the notification for applying the ALD signal and the information for synchronizing the display driving, touch sensing and fingerprint sensing operations. The detailed operations of the display system 90 are similar to the operations of the display system 80 as described above, and will be omitted herein for brevity.

Figure 10:
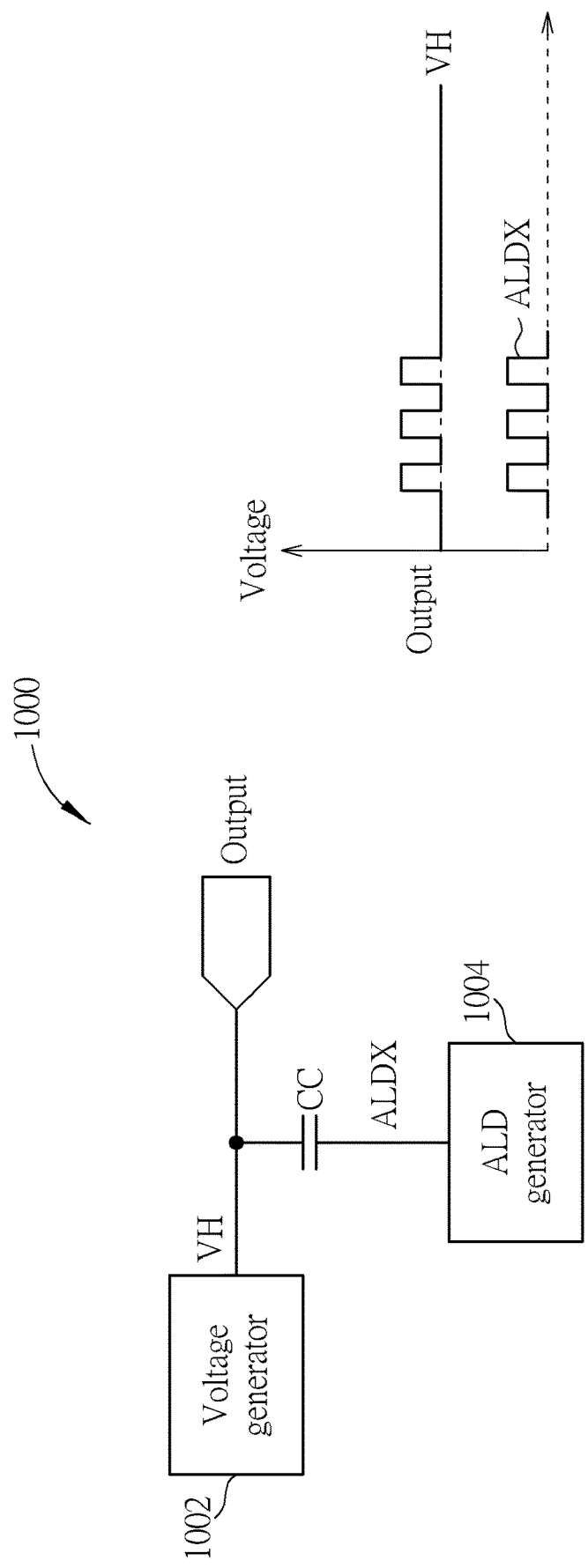
FIG. 10 is a schematic diagram of the ALD circuit according to an embodiment of the present invention.

The ALD circuit of the FTDI circuit 802 or the FPR ROIC 903 may be implemented in any possible manners. Please refer to FIG. 10, which is a schematic diagram of an ALD circuit 1000 according to an embodiment of the present invention. As shown in FIG. 10, the ALD circuit 1000 includes a voltage generator 1002, an ALD generator 1004 and a coupling capacitor CC. The voltage generator 1002 is configured to generate a voltage VH. The voltage VH may be any possible voltage such as a control voltage for the control signal line or a power voltage for the voltage source line. The ALD generator 1004 is configured to generate an original ALD signal ALDX. The original ALD signal ALDX may be a periodic signal having any type of pulses such as a sinusoidal wave, square wave, triangular wave or trapezoidal wave. The original ALD signal ALDX may be coupled to the output terminal of the ALD circuit 1000 through the coupling capacitor CC, to be carried on the level of the voltage VH and outputted by the ALD circuit 1000, as shown in FIG. 10.

Figure 11A:
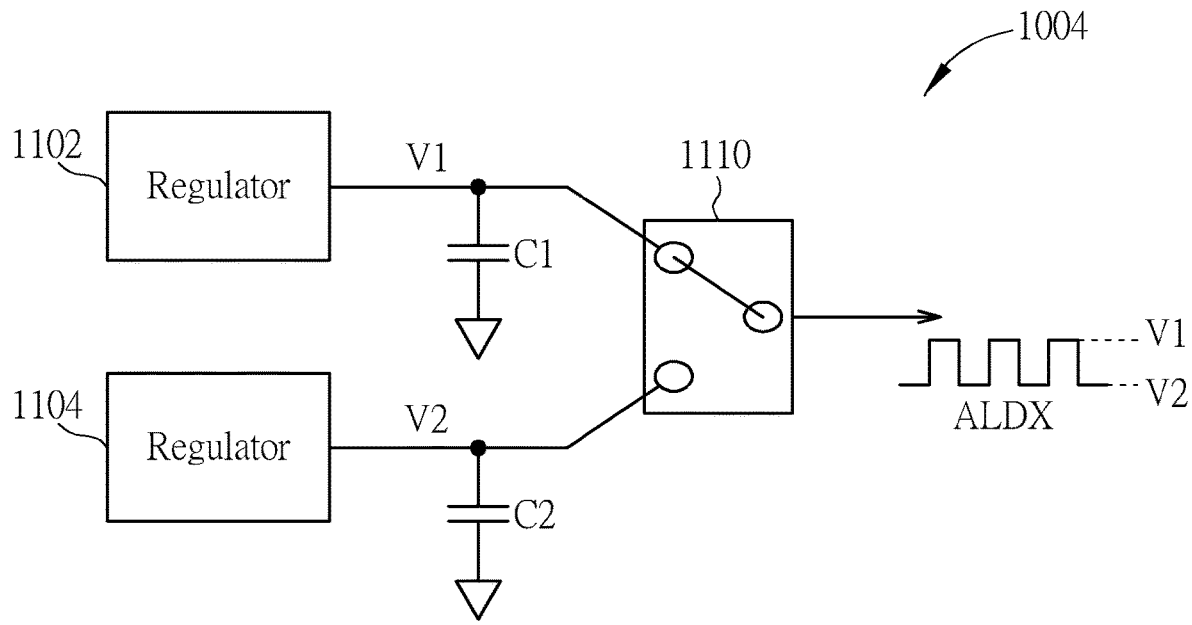
FIGS. 11A and 11B are schematic diagrams of detailed implementations of the ALD generator.

FIG. 11A illustrates a detailed implementation of the ALD generator 1004. As shown in FIG. 11A, the ALD generator 1004 includes voltage regulators 1102 and 1104, capacitors C1 and C2 and a switch module 1110. The voltage regulator 1102 is configured to generate and output a voltage V1 and the voltage regulator 1104 is configured to generate and output a voltage V2, where the value of the voltage V1 may be higher than the value of the voltage V2 with an appropriate difference. The capacitors C1 and C2, respectively coupled to the output terminal of the voltage regulators 1102 and 1104, may be served to improve the stability of the voltages V1 and V2. The switch module 1110 may receive the voltages V1 and V2, and alternately output the voltages V1 and V2 with appropriate control of the switches, in order to generate the original ALD signal ALDX. In this implementation, the original ALD signal ALDX may be a square-wave signal switched between the levels of the voltages V1 and V2.

Figure 11B:
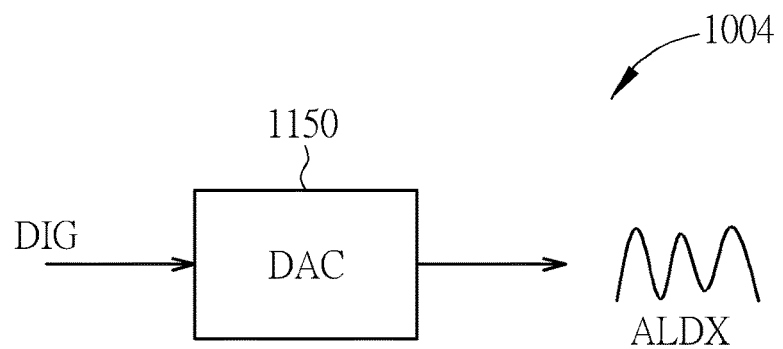

FIG. 11B illustrates another implementation of the ALD generator 1004. As shown in FIG. 11B, the ALD generator 1004 includes a digital-to-analog converter (DAC) 1150. The DAC 1150 may receive a series of digital codes DIG, and correspondingly generate and output the original ALD signal ALDX by converting the digital codes DIG into analog voltages. In this implementation, the original ALD signal ALDX may have any possible waveform based on the received digital codes DIG.

Figure 12:
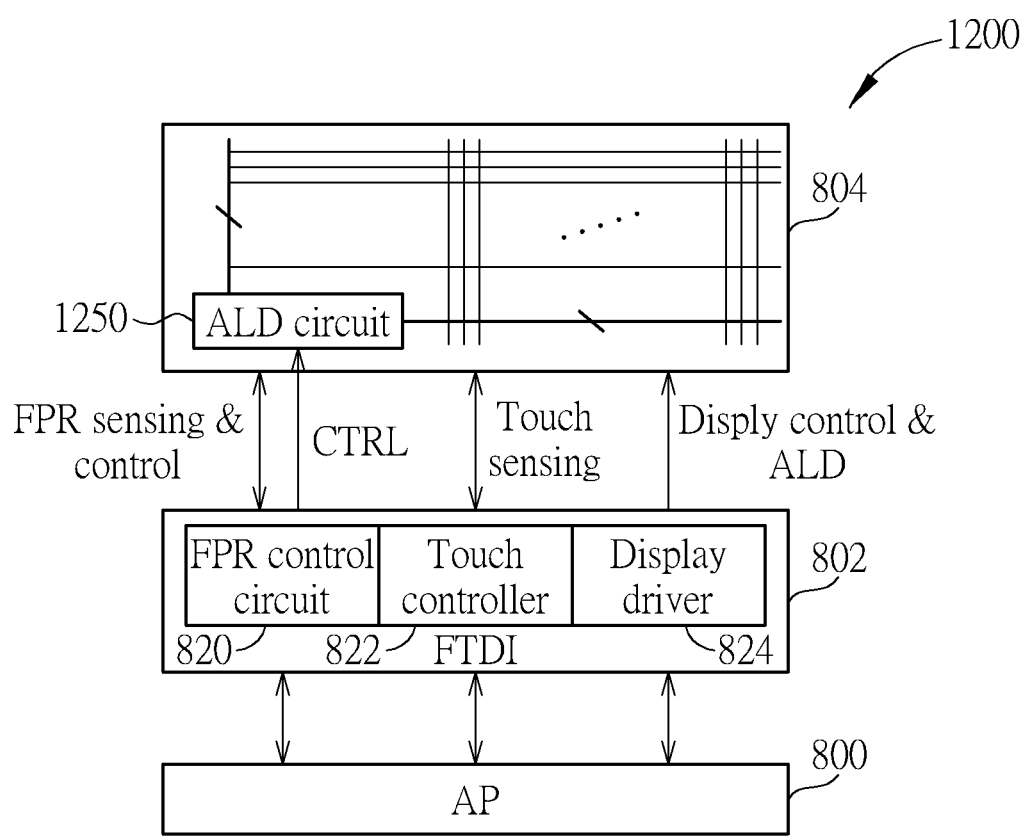
FIG. 12 is a schematic diagram of another display system according to an embodiment of the present invention.

As mentioned above, the ALD circuit may be included in the FTDI circuit 802 as shown in FIG. 8 or may be included in the FPR ROIC 903 as shown in FIG. 9. In another embodiment, an ALD circuit may be implemented in the fingerprint sensor of the display panel. Please refer to FIG. 12, which is a schematic diagram of another display system 1200 according to an embodiment of the present invention. The circuit structure of the display system 1200 is similar to the circuit structure of the display system 80, so signals and elements having similar functions are denoted by the same symbols. As shown in FIG. 12, the display system 1200 is different from the display system 80 in that, in the display system 1200, the ALD circuit 1250 is implemented in the fingerprint sensor of the display panel 804. The ALD circuit 1250 may be coupled to the fingerprint sensing pixel array, and perform its operation by receiving a control signal CTRL from the FTDI circuit 802. For example, the ALD circuit 1250 may have a structure similar to the ALD circuit 1000 shown in FIG. 10, where the ALD generator 1004 may output the original ALD signal ALDX when it is enabled or triggered by the control signal CTRL. Alternatively, the control signal CTRL may be the original ALD signal ALDX, which is configured to drive the ALD circuit 1250 to output the ALD signal on an intended voltage level.

In another embodiment, the configurations of including the ALD circuit in the fingerprint sensor may also be combined with the 2-chip structure having a fingerprint readout circuit and a TDDI circuit as shown in FIG. 9. The related operations of this implementation are similar to those described above, and will not be narrated herein.

It should also be noted that the embodiments of the present invention aim at providing a control method for an optical fingerprint sensor and a related control circuit and optical fingerprint sensor. Those skilled in the art may make modifications and alternations accordingly. It is well known that there are various types of pixel structures in the fingerprint sensing layer of the display panel, and the pixel structure described in this disclosure is one of various implementations of the fingerprint sensing pixel. For example, an additional switch may be disposed between the optoelectronic element and the storage capacitor, so that the exposure time may be controlled by operating the switch. In such a situation, the ALD signal(s) may be applied based on the structure of the fingerprint sensing pixel.

In addition, the deployment of row (horizontal) control signal lines, column (vertical) sensing lines and column (vertical) voltage source lines shown in FIG. 4 is one of various embodiments of the present invention. In another embodiment, the sensing lines and the voltage source lines may be disposed along the horizontal direction, and the control signal lines may be disposed along the vertical direction; or several of the control signal lines may be disposed along the horizontal direction and other control signals may be disposed along the vertical direction. The row/column control circuits for the fingerprint sensing pixels may be disposed correspondingly. For example, if the sensing lines are row sensing lines disposed along the horizontal direction, the row control circuit may include a sensor module capable of receiving the sensing signals. The deployments of these lines and the control circuits may not be a limitation to the scope of the present invention.

Further, the method of applying the ALD signal(s) to the fingerprint sensing pixels may be applied to any type of display panel which is integrated with touch and fingerprint sensing functions, such as a liquid crystal display (LCD) panel, an organic light-emitting diode (OLED) panel, or a plasma display panel (PDP). As for the LCD panel, the ALD operations are applicable in an in-cell, on-cell or out-cell LCD panel. Note that it is more preferable to apply the ALD signal in an in-cell touch panel with fingerprint sensing functions, since the touch sensing layer is much closer to the fingerprint sensing layer under the in-cell structure, but the implementations should not be limited thereto.

Figure 13:
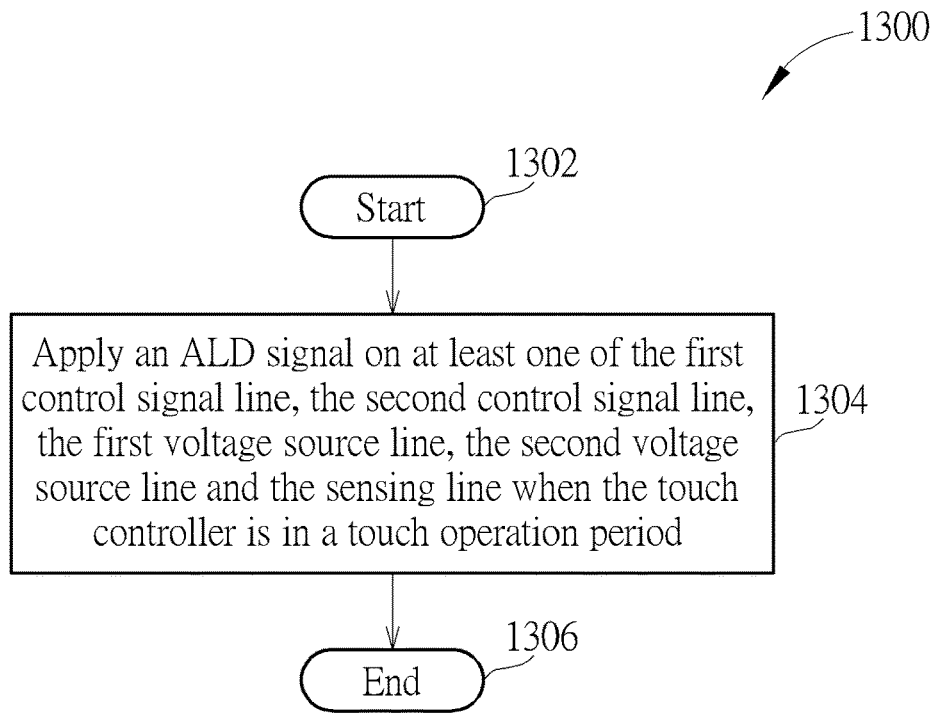
FIG. 13 is a schematic diagram of a process according to an embodiment of the present invention.

The abovementioned operations of the optical fingerprint sensor and the fingerprint control circuit may be summarized into a process 1300, as shown in FIG. 13. The process 1300, which may be realized in the fingerprint control circuit or the ALD circuit, may be performed on the optical fingerprint sensor integrated with a touch controller and having a plurality of fingerprint sensing pixels, where each pixel may include a first control signal line and a second control signal line, and may be coupled to a first voltage source line, a second voltage source line and a sensing line, as the pixel structure shown in FIG. 3. As shown in FIG. 13, the process 1300 includes the following steps:

Step 1302: Start.

Step 1304: Apply an ALD signal on at least one of the first control signal line, the second control signal line, the first voltage source line, the second voltage source line and the sensing line when the touch controller is in a touch operation period.

Step 1306: End.

Figure 14:
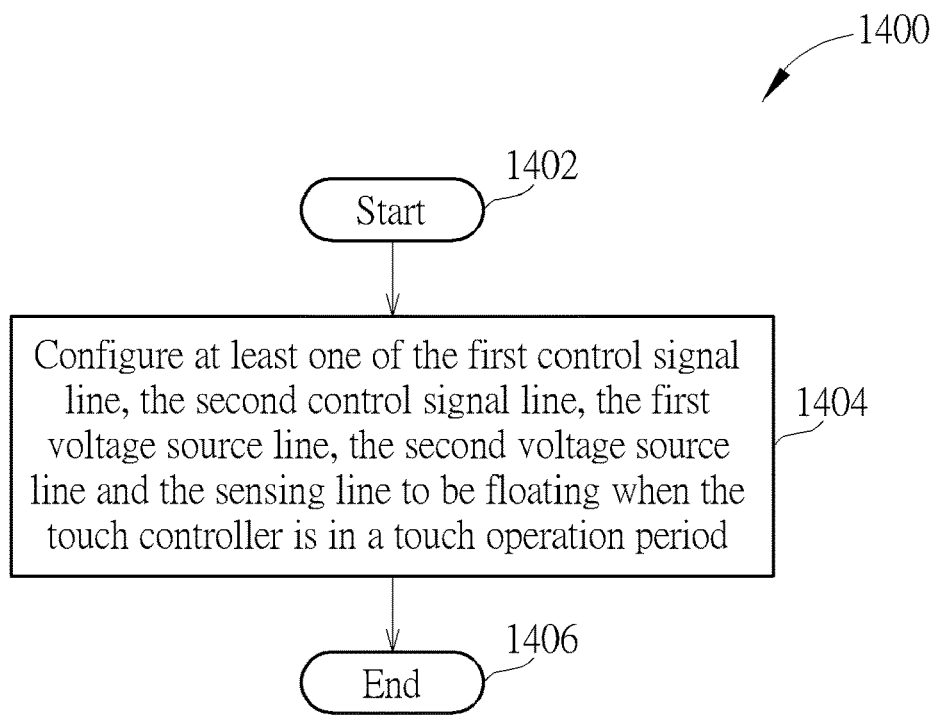
FIG. 14 is a schematic diagram of another process according to an embodiment of the present invention.

Note that those lines among the first control signal line, the second control signal line, the first voltage source line, the second voltage source line and the sensing line not applied with the ALD signal may be controlled to be floating. Further, the fingerprint control circuit may also adopt a control method mainly based on floating, as the process 1400 shown in FIG. 14, where the process 1400 includes the following steps:

Step 1402: Start.

Step 1404: Configure at least one of the first control signal line, the second control signal line, the first voltage source line, the second voltage source line and the sensing line to be floating when the touch controller is in a touch operation period.

Step 1406: End.

The detailed implementations and alternations of the processes 1300 and 1400 are illustrated in the above paragraphs, and will not be narrated herein.

To sum up, the embodiments of the present invention provide a control method for an optical fingerprint sensor and the related control circuit and optical fingerprint sensor. The optical fingerprint sensor may be integrated with a touch panel, where one of the touch sensing layer and the fingerprint sensing layer may be superposed on and close to the other one, resulting in large capacitive loading due to the coupling capacitors between the touch sensing layer and the fingerprint sensing layer. During the touch operation period, the touch signal may generate capacitive loading on the lines of the fingerprint sensing pixels. In order to eliminate or reduce the capacitive loading, an ALD signal may be applied on the lines of the fingerprint sensing pixels. The ALD signal may be applied to drive the line(s), where the ALD signal has a frequency, phase, and/or amplitude substantially identical to the frequency, phase, and/or amplitude of the touch signal, respectively. Alternatively or additionally, the ALD operation may be realized by controlling the target node (s) of the fingerprint sensing pixels to be floating. The ALD operation may be performed during the touch operation period of the touch controller and/or the exposure period of the optical fingerprint sensor. The lines of a fingerprint sensing pixel receiving the ALD signal may include the line directly coupled to the storage capacitor of the pixel and the line coupled to the storage capacitor through a transistor. With the ALD operation, the voltages at both terminals of the storage capacitor may not be interfered with by the touch signals, so as to maintain the accuracy of fingerprint sensing signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method for an optical fingerprint sensor and a touch controller, the optical fingerprint sensor comprising a plurality of pixels, each of the pixels having a first control signal line and a second control signal line, each of the pixels further coupled to a first voltage source line, a second voltage source line and a sensing line, the control method comprising:

configuring at least one of the first control signal line, the second control signal line, the first voltage source line, the second voltage source line and the sensing line to be floating when the touch controller is in a touch operation period.

2. The control method of claim 1, further comprising:
applying a direct current (DC) voltage on at least one of the first control signal line, the second control signal line, the first voltage source line, the second voltage source line and the sensing line when the touch controller is in the touch operation period.

3. The control method of claim 2, wherein any line among the first control signal line, the second control signal line, the first voltage source line, the second voltage source line and the sensing line not configured to be floating is applied with the DC voltage in the touch operation period.

4. The control method of claim 1, further comprising:
applying a control signal to a switch to configure at least one of the first control signal line, the second control signal line, the first voltage source line, the second voltage source line and the sensing line to be floating when the touch controller is in the touch operation period.

5. A control method for a control circuit of an optical fingerprint sensor, the control circuit integrated with a touch controller and a display driver in a chip, the optical fingerprint sensor comprising a plurality of pixels, each of the pixels having a first control signal line and a second control signal line, each of the pixels further coupled to a first voltage source line, a second voltage source line and a sensing line, the control method comprising:
applying an anti-loading driving (ALD) signal on at least one of the first control signal line, the second control signal line, the first voltage source line, the second voltage source line and the sensing line when the touch controller is in a touch operation period.

6. The control method of claim 5, further comprising:
applying a direct current (DC) voltage on at least one of the first control signal line, the second control signal line, the first voltage source line, the second voltage source line and the sensing line when the touch controller is in the touch operation period.

7. The control method of claim 6, wherein any line among the first control signal line, the second control signal line, the first voltage source line, the second voltage source line and the sensing line not applied with the ALD signal is configured to be floating or applied with the DC voltage.

8. The control method of claim 5, wherein the ALD signal is applied during an exposure period of the optical fingerprint sensor.

9. The control method of claim 5, wherein the ALD signal comprises a pulse having a frequency and a phase substantially identical to a frequency and a phase of a touch signal of the touch controller, respectively.

10. The control method of claim 9, wherein an amplitude of the ALD signal is substantially identical to an amplitude of the touch signal.

* * * * *